United States Patent [19]

Aizawa et al.

[11] Patent Number: 4,558,213
[45] Date of Patent: Dec. 10, 1985

[54] PICKUP LEVEL CONTROL DEVICE FOR A SYSTEM FOR READING OUT RECORDED INFORMATION

[75] Inventors: Koki Aizawa; Yoshiyuki Takizawa; Akira Haeno; Akira Motoyama, all of Tokorozawa, Japan

[73] Assignee: Pioneer Electronic Corporation, Tokyo, Japan

[21] Appl. No.: 499,357

[22] Filed: May 31, 1983

[30] Foreign Application Priority Data

Jun. 1, 1982 [JP] Japan ............................ 57-093286

[51] Int. Cl.⁴ ............................................. H01J 40/14
[52] U.S. Cl. .................................. 250/214 R; 250/209; 369/48
[58] Field of Search ....... 250/214 R, 214 AG, 214 A, 250/209; 330/282, 284, 86; 455/600, 602, 608, 617, 619; 369/100, 109, 124, 46, 48

[56] References Cited

U.S. PATENT DOCUMENTS

| | | | |
|---|---|---|---|
| 3,581,223 | 5/1971 | Armstrong | 330/282 |
| 4,320,348 | 3/1982 | Suzuki et al. | 330/284 |
| 4,415,803 | 11/1983 | Muoi | 250/214 AG |
| 4,459,475 | 7/1984 | Flint et al. | 250/214 AG |

*Primary Examiner*—Edward P. Westin
*Attorney, Agent, or Firm*—Fleit, Jacobson, Cohn & Price

[57] ABSTRACT

A pickup level control device for a system for reading out recorded information which has a pickup element producing a pickup output signal. The device detects a dc component of the pickup output signal and produces a level control signal. A voltage level of the pickup output signal is controlled in response to the level control signal produced by the dc level detection operation. The control of the voltage level of the pickup output signal is performed by a variable impedance element connected to a terminal of the pickup element, so that a peak level of an ac component of the pickup output signal is controlled below a predetermined level.

5 Claims, 3 Drawing Figures

PICKUP LEVEL CONTROL DEVICE FOR A SYSTEM FOR READING OUT RECORDED INFORMATION

BACKGROUND OF THE INVENTION

1. Field of the Invention

The present invention relates to a pickup level control device for a system for reading out recorded information, and more specifically to a device for controlling the level of an output signal from photoelectric converting elements of a pickup for an optical system for reading out recorded information.

2. Description of Background Information

In an optical system for reading out recorded information, for example, a read out laser beam is applied, via an object lens, as a light spot on a recording surface of a recording medium. With this arrangement, a signal corresponding to the recorded information is reproduced from an output signal of a photo detector for the photoelectric conversion, which detects a reflectd light of the incident laser beam from the recording surface of the recording medium. However, due to a deviation of the reflection factor, for example, according to the shape of pits on the recording disc used as a recording medium and/or due to a deviation of the sensitivity of the photo dectector, the level of a pickup signal, i.e., an output signal of the photoelectric transducer tends to vary widely. Accordingly, if the output signal level of the photoelectric transducer is exceedingly high, there is a risk that a circuit for processing the signal at a further stage will be saturated, which will result in a number of faults in the reproduced information. Such a variation of the output level of the photoelectric transducer is disadvantageous especially when a recording disc on which a Pulse Code Modulation (PCM) signal is recorded as recorded information. The reproduction of the recorded information is executed by amplifying the output signal of the photoelectric transducer and then campared with the amplified signal with a predetermined reference level. More specifically, an asymmetrical ac (alternating current) signal, that is, an ac signal with clipped positive peaks for example, will be obtained if the amplifying stage is saturated. As mentioned above, this is quite disadvantageous in the case of the PCM process since normally a zero level comparator is used as the level comparator. In short, there is a risk in the conventional arrangement that false data of a recording signal will be obtained by a zero level comparison of such an asymmetrical ac output signal.

SUMMARY OF THE INVENTION

An object of the present invention is to provide a level control device for a system for reading out recorded information, which can eliminate the possibility of reproducing false information which frequently happens when the level of the photoelectrically converted signal from the pickup means is exceedingly high.

According to the present invention, a pickup level control device for a system for reading out recorded information having a pickup element producing a pickup output signal, contains a dc level detection means for detecting a dc component of the pickup output signal and producing a level control signal, and a control means for controlling a voltage level of the pickup output signal in accordance with the level control signal produced by the dc level detection means.

According to another aspect of the invention, the control means comprises a variable impedance element connected to a terminal of the pickup element, whereby controlling a level of an ac component of the pickup output signal.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become apparent from the following description taken in conjunction with the accompanying drawings which are given as an illustration only, and thus are not a limitation of the present invention, and wherein.

DETAILED DESCRIPTION OF A PREFERRED EMBODIMENT

Figure 1:
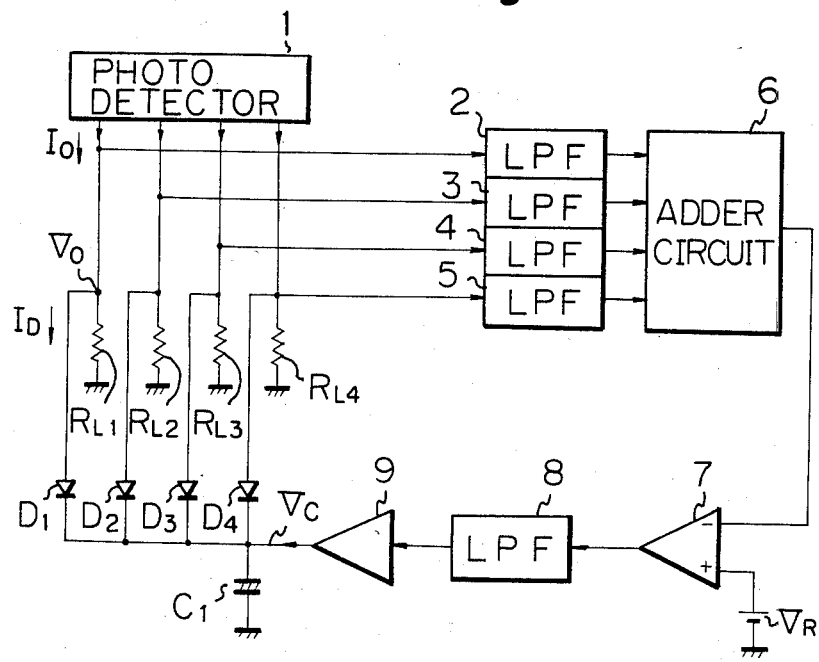
FIG. 1 is a block diagram of an embodiment of the pickup level control device according to the present invention.

Reference is first made to FIG. 1 in which the circuit construction of the device is illustrated. As shown, a photoelectric transducer of a pickup means consists of a so called four segment photo detector 1 (referred to as a photo detector hereinafter) which has four independent photo sensitive cells formed by dividing a photo sensitive element along a couple of split lines crossing at right angles to each other. Respectively four output signals of the photo detector 1 develop at terminals of load resistances $R_{L1}$, $R_{L2}$, $R_{L3}$, and $R_{L4}$ and can be connected in a desirable manner to produce various signals. As an example, a sum of these four signals is used for reproducing the recorded information. Also, a difference value between a sum of a predetermined two of these signals and a sum of the remaining two of these signals will be used for obtaining an error signal of a focus servo circuit which maintains a constant distance between an object lens (not shown) and a recording surface of a recording disc.

These four output signals of the photo detector 1 developed at the terminals of the load resistances $R_{L1}$ through $R_{L4}$ are applied to input terminals of corresponding Low Pass Filters (LPF) 2, 3, 4, and 5. DC components obtained in the LPFs 2 through 5 are then applied to an adder circuit 6 in which input signals are added with each other. An output signal of the adder circuit 6 is applied to a differential amplifier 7 and in which the output signal from the adder circuit 6 is compared with a predetermined reference level. An output signal of the differential amplifier 7 is then applied to a control amplifier 9 via a Low Pass Filter (LPF) 8 which is used for rejecting higher frequency components which might affect the operation of the device, and for eliminating a modulation by a ripple component contained in the output signal of the differential amplifier 7.

Further, a plurality of variable impedance elements which take the form of diodes $D_1$, $D_2$, $D_3$, and $D_4$ are provided for controlling the output level of the photo detector 1. The cathodes of the diodes $D_1$ through $D_4$ are respectively connected to the terminals of the load resistances $R_{L1}$ through $R_{L4}$ and the anodes thereof are commonly connected to an output terminal of the control amplifier 9. Also, a capacitor $C_1$, a terminal of which is grounded, is connected to the output terminal of the control amplifier 9.

The operation of the differential amplifier 7 will be further explained hereinafter. When a voltage level $V_A$ of the output signal of the adder circuit 6, which is responsive to the magnitude of the output current of the photo detector 1, is lower than the reference level $V_R$ the differential amplifier 7 produces a high level output voltage which increases in response to the difference between $V_A$ and $V_R$. Consequently, a voltage level $V_c$ of the output signal of the control amplifier 9 will be higher than a predetermined value, and therefore the diodes $D_1$ through $D_4$ are cut off and no forward current flows therethrough. In this state, the voltage level at the load resistances $R_{L1}$ through $R_{L4}$ increase with the increase of the current flowing through them similar to the conventional arrangement. In other words, no control of the output level of the photo detector is effected.

On the other hand, when the level of the output signal $V_A$ of the adder circuit 6 becomes higher than the reference voltage $V_R$, the differential amplifier 7 produces a low level output signal which decreases with the increase in the difference between $V_A$ and $V_R$. Therefore, the voltage level of the output signal of the control amplifier 9 goes down and the forward currents (which will be designated as $I_D$ hereafter) flow through the diodes $D_1$ through $D_4$. In this state, the current through the load resistance $R_{L1}$ through $R_{L4}$ decreases to a value ($I_0-I_D$) and consequently, the voltage level of the output signal of the photo detector 1 goes down. Further, with this operation, the level $V_A$ of the output signal of the adder circuit 6 will be reduced to the level of the reference voltage $V_R$.

Figure 3:
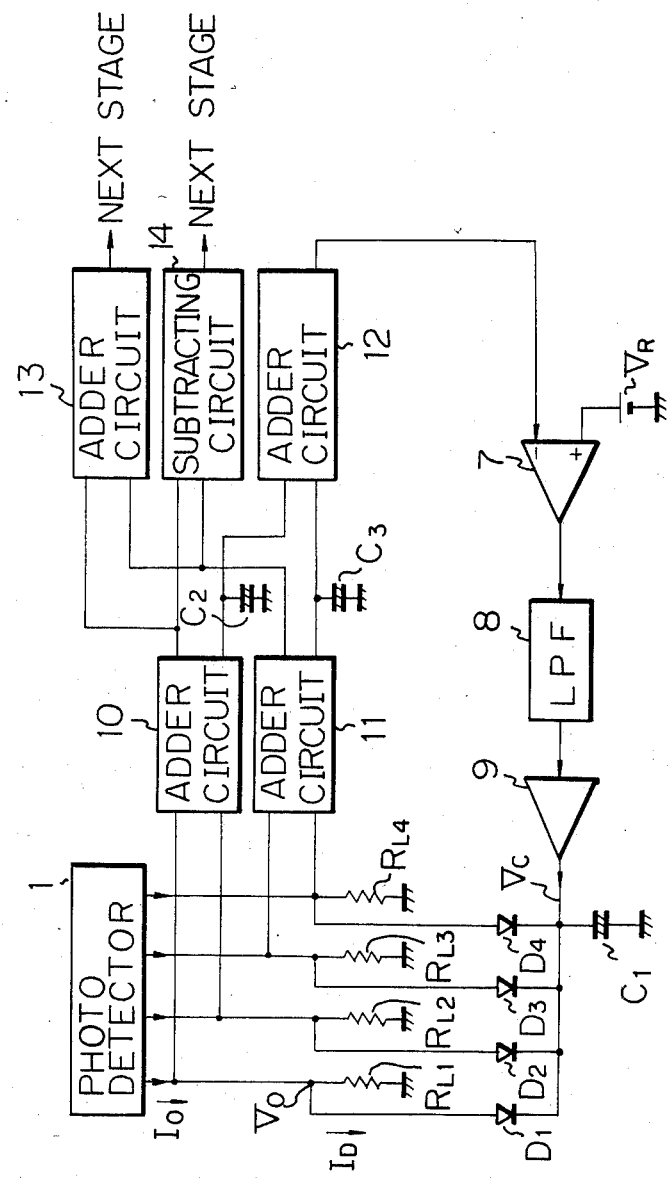
FIG. 3 is a block diagram of another example of the circuit arrangement of the pickup level control device according to the present invention.

Reference is now made to FIG. 3 in which another example of the circuit construction of the pickup level control device is illustrated. As shown, this example features the LPFs 2 through 5 and the adder circuit 6 of the previous example. These are replaced by a pair of adder circuits 10 and 11, and an adder circuit 12. The adder circuit 10 receives the output signals to the photo detector 1 which develop at the terminals of the load resistances $R_{L1}$ and $R_{L2}$. An output signal produced at the first terminal is supplied to an adder circuit 13 and a subtracting circuit 14. Also, the adder circuit 11 receives the output signals of the photo detector 1 at the terminals of the load resistances $R_{L3}$ and $L_{L4}$ and the output signal thereof is supplied to the adder circuit 13 and the subtracting circuit 14. The adder circuit 10 has another output terminal at which a capacitor $C_2$ is connected and an output signal which is produced at this terminal is then applied to the adder circuit 12. With the provision of the capacitor $C_2$, high frequency components of the output signal of the adder circuit 10 are bypassed to ground and only the dc component is applied to the adder circuit 12. Similarly, the adder circuit 11 has another output terminal to which a capacitor $C_3$ is connected. The dc component of an output signal produced at this terminal is applied to the adder circuit 12. Consequently, the adder circuit 12 produces a signal corresponding to the sum of the dc components of the four output signals of the photo detector 1. In this way, the circuit shown in FIG. 3 performs the same operation as that of the circuit shown in FIG. 1. In addition, RF signals produced at the output terminals of the adder circuit 13 and subtracting circuit 14 are to be treated by signal processing circuits of the next stage of the system for reading out recorded information.

Figure 2:
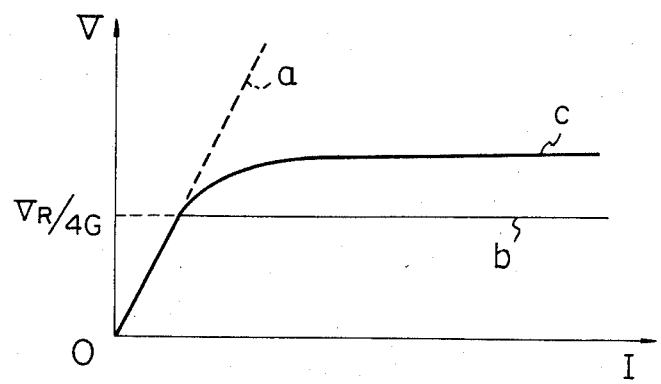
FIG. 2 is a graph showing an operational characteristics of the circuit shown in FIG. 1.

Before further explaining the operation of the variable impedance elements, reference is first made to FIG. 2 in which the output signal characteristics of the photoelectric transducer without the incorporation of the variable impedance element is illustrated by a dashed line a. As shown, the output voltage level V of the photoelectric transducer, which develops across the terminals of a load resistance, linearly increases with the current I flowing through it. Therefore, if the current I increases excessively, the output voltage V will go above a level which will cause the saturation of the amplifiying circuit of the further stage.

The operation of the diodes $D_1$ through $D_4$ as the variable impedance elements will be explained hereinafter. Since the anodes of the diodes $D_1$ through $D_4$ are grounded through the capacitor $C_1$, the value of the impedance loaded to each cell of the photo detector will be equal to a combined value of the respective one of the load resistances $R_{L1}$ through $R_{L4}$ and respective one of the diodes $D_1$ through $D_4$.

More specifically, the current to voltage characteristics of a diode is generally expressed by the following equation:

$$I_D = I_S(\epsilon^{qV_D/mkT} - 1) \tag{1}$$

in which $V_D$ is a voltage across the terminals of the diode, $I_D$ is a current flowing through the diode, $I_S$ is a reverse saturation current, q is the charge of an electron, k is the Boltzmann's constant, T is the absolute temperature, and m is an empirical constant.

If, in the equation (1), $V_D$ has a positive value which is sufficiently greater than the value of mkT/q, then the equation (1) can be simplified into the following equation (2).

$$I_D \approx I_S \epsilon^{qV_D/mkT} \tag{2}$$

The equation (2) can be modified as follows.

$$V_D = mkT/q \ln(I_D/I_S) \tag{3}$$

By differentiating the equation (3), the following equation (4) will be obtained, which indicates the resistance value of the diode.

$$r = \frac{dV_D}{dI_D} = \frac{mkT}{q}/I_D \tag{4}$$

As mentioned before, the combined value of this resistance value r and the value of the load resistance will be loaded to the photo detector 1. Accordingly, the device according to the present invention is constructed to control the resistance value r of the diode in accordance with the level of the dc component contained in the photo detector 1 so as to suppress the exceedingly high output voltage of the photo detector 1.

When the diodes $D_1$ through $D_4$ are turned on, the following three equations (5) through (7) will be obtained:

$$V_0 = R_L(I_0 - I_D) \quad (5)$$
$$V_C = A(-4GV_0 + V_R) \quad (6)$$

$$V_0 - V_c = V_D = \frac{mkT}{q} \ln(I_D/I_S) \quad (7)$$

in which $I_0$ is a dc component of the output current of the photo detector, $V_o$ is the voltage developed across the terminals of the load resistance, $V_c$ is the voltage level at the cathodes of the diodes $D_1$ through $D_4$, G is the gain of the adder circuit 6, A is the overall gain from the differential amplifier 7 to the control amplifier 9, and $V_R$ is a reference voltage.

Using equations (5) through (7), the following equation (8) can be obtained.

$$\frac{mkT}{q} \ln(I_D/I_S) = (1 + 4AG)(I_0 - I_D)R_L - AV_R \quad (8)$$

Then, the equation (8) can be modified as follows.

$$I_0 = I_D + \left(\frac{mkT}{q} \ln(I_D/I_S) + AV_R\right) / (1 + 4AG)R_L \quad (9)$$

If the gain A is sufficiently large, then the following equation (10) can be obtained.

$$I_0 \approx I_D + AV_R/(1+4AG)R_L \quad (10)$$

By substituting the equation (10) for the equation (5), the following equation (11) will be obtained.

$$V_0 = AV_R/(1+4AG) \approx V_R/4G \quad (11)$$

Accordingly, when the diodes $D_1$ through $D_4$ are turned on, the voltage level at the terminal of the load resistance will be clamped to the voltage $V_R/4G$ which is present in equation (11). The current to voltage characteristics of the photo detector in this state is illustrated by the straight line b of FIG. 2. Obviously the voltage across the load resistance increases linearly with the current flowing therethrough when the output current of the photo detector 1 is relatively small and the diodes $D_1$ through $D_4$ are turned off.

The operation of the circuit using an ac (varying) output current of the photo detector 1 will be explained hereinafter.

If there is an ac output current from the photo detector, an alternating voltage develops across the resistance $R_L$, and a dc current flows through the load resistance $R_L$. These can respectively be expressed as $i_o$, $v_o$, and $I_L$. The following equation (12) can be obtained:

$$v_0 = \left(\frac{mkT}{q} i_0 R_L/(I_0 - I_L)\right) / \left(\frac{mkT}{q} /(I_0 - I_L) + R_L\right) \quad (12)$$
$$= \frac{mkT}{q} i_0 R_L / \left\{ I_0 \left( R_L + \left(\frac{mkT}{q} - I_L R_L\right) / I_0 \right) \right\}$$

Due to characteristics of the recorded information, there is a relationship between $i_o$ and $I_o$, which is expressed as following.

$$i_0 = \alpha I_0 \quad (0 < \alpha < 1) \quad (13)$$

By substituting equation (13) into equation (12), the following equation (14) will be obtained.

$$v_0 = \frac{mkT}{q} \alpha R_L / \left\{ R_L + \left(\frac{mkT}{q} - I_L R_L\right) / I_0 \right\} \quad (14)$$

If the dc component of the output signal of the photo detector 1 increases up to infinity ($I_o \to \infty$), then equation (14) will be simplified to the following equation (15).

$$v_0 = \alpha mkT/q \quad (15)$$

Thus, the ac component $v_o$ of the voltage across the load resistance $R_L$ will converge to the value expressed in the equation (15) in accordance with the increase of the dc current from the photo detector 1.

The obtained relationship between the ac voltage level and the current in the load resistance $R_L$ will vary as shown by the curved line c of FIG. 2.

Specifically, an ac output voltage $v_c$, which is proportional to a product of the resistance value of the load resistance $R_L$ and the value of the current flowing through is obtained prior to the diodes $D_1$ through $D_4$ turning on. Conversely, when the diodes $D_1$ through $D_4$ turn on, the resistance r of the diode, which is expressed by equation (4), is controlled in accordance with a so called limiter signal ($V_c$) from the control amplifier 9, and therefore, the load impedance of the photo detector 1 becomes variable and is equal to the combined impedance $R_L//r$. Generally, the value of the load resistance $R_L$ is much greater than the resistance of the diode r ($R_L >> r$), and thus the load impedance value $R_L//r$ will be almost equal to r ($R_L//r \approx r$). Therefore, due to the increase of the value of the load impedance, the level of the ac component of the output voltage is suppressed as shown by the curved line c of FIG. 2. In this way, the device, according to the present invention, substantially operates as a limiter circuit which suppresses the ac component of the pickup output signal.

It is apparent from the foregoing that the device according to the present invention has a limiter characteristic against the high amplitude ac component of the output signal of the photo detector. Therefore the possibility that the amplifying circuit in further stages would be saturated by an input signal having a high amplitude is eliminated.

It should be understood that the foregoing description is for illustrative purposes only, and is not intended to limit the scope of the invention. Rather, there are numerous equivalents to the preferred embodiments, and such are intended to be covered by the appended claims.

As an example, instead of using diodes as in the preferred embodiment, a collector saturation resistance of a transistor or a resistance between the drain and the source of an Field Effect Transistor (FET) can be used as the variable impedance connected to the photo detector. However, in the case of a four segment type photo detector which was used in the preferred embodiment, it is necessary that the load impedances for each cell of the photo detector be uniform. Therefore, it is suitable to use diodes as variable impedance elements for each photo detector because the resistance of a diode in an operating region is determined in accordance with physical constants and an empirical constant as shown in equation (4). The empirical constant can be uniform, for example, by using diode-connected transistor array, and therefore, the resistance r can easily be uniform.

What is claimed is:

1. A pickup level control device for a system for reading out recorded information having a pickup which produces a plurality of pickup output signals, comprising:
   dc level separating means for separating dc components of said pickup output signals and producing a plurality of dc signals;
   adding means for adding said dc signals of said dc level separating means and producing an adder output signal; and
   a control means for controlling a voltage level of said pickup output signal in response to said adder output signal produced by said adding means.

2. A device as set forth in claim 1, wherein said pickup output signals include ac components and wherein said control means includes a plurality of variable impedance elements connected to said pickup and said control means is adapted to limit dc levels of said pickup output signals within a predetermined level, thereby controlling levels of said ac components of said pickup output signals differently from the dc levels of the pickup output signals.

3. A device as set forth in claim 1, further comprising a plurality of load resistances connected to said pickup and wherein said dc level separating means comprises a low pass filter connected to said pickup, said control means comprises a differential amplifier connected to said adding means and supplied with a dc reference voltage, and a control amplifier for producing a control signal for limiting the dc levels of said pickup output signals within a predetermined level in response to an output signal of said differential amplifier.

4. A device as set forth in claim 3, wherein said pickup output signals include ac components and wherein said control means includes a plurality of variable impedance elements connected to said pickup in parallel with said load resistances, whereby to limit the dc levels of said pickup output signals and to vary load impedances of said pickup in accordance with a voltage level of said control signal from said control amplifier so that levels of said ac components of said pickup output signals are controlled by variations of the load impedances of said pickup.

5. A device as set forth in claim 4, wherein said pickup includes a terminal and wherein each said variable impedance element is a diode having a cathode connected to said terminal of said pickup at which said load resistance is connected, and an anode connected to an output terminal of said control amplifier.

* * * * *